(12) United States Patent
Bih et al.

(10) Patent No.: US 11,177,365 B2
(45) Date of Patent: Nov. 16, 2021

(54) SEMICONDUCTOR DEVICE WITH ADHESION LAYER

(71) Applicant: TAIWAN SEMICONDUCTOR MANUFACTURING COMPANY, LTD., Hsinchu (TW)

(72) Inventors: Shih Wei Bih, Taichung (TW); Chun-Chih Lin, Taipei (TW); Yen-Yu Chen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 17 days.

(21) Appl. No.: 16/695,006

(22) Filed: Nov. 25, 2019

(65) Prior Publication Data

US 2020/0098892 A1 Mar. 26, 2020

Related U.S. Application Data

(62) Division of application No. 15/708,593, filed on Sep. 19, 2017, now Pat. No. 10,490,649.

(Continued)

(51) Int. Cl.
| | |
|---|---|
| *H01L 29/66* | (2006.01) |
| *H01L 21/28* | (2006.01) |
| *H01L 21/321* | (2006.01) |
| *H01L 21/326* | (2006.01) |
| *H01L 29/49* | (2006.01) |
| *H01L 29/78* | (2006.01) |
| *H01L 29/423* | (2006.01) |
| *H01L 29/51* | (2006.01) |

(Continued)

(52) U.S. Cl.
CPC .. *H01L 29/66545* (2013.01); *H01L 21/28079* (2013.01); *H01L 21/28088* (2013.01); *H01L 21/28185* (2013.01); *H01L 21/321* (2013.01); *H01L 21/326* (2013.01); *H01L 29/42376* (2013.01); *H01L 29/4958* (2013.01); *H01L 29/4966* (2013.01); *H01L 29/66795* (2013.01); *H01L 29/7851* (2013.01); *H01L 29/0847* (2013.01); *H01L 29/41791* (2013.01); *H01L 29/42364* (2013.01); *H01L 29/513* (2013.01); *H01L 29/517* (2013.01); *H01L 29/518* (2013.01)

(58) Field of Classification Search
CPC ......... H01L 29/66545; H01L 29/42376; H01L 29/4958; H01L 29/4966; H01L 29/66795; H01L 21/28079; H01L 21/28088; H01L 21/28185
See application file for complete search history.

(56) References Cited

U.S. PATENT DOCUMENTS

| | | |
|---|---|---|
| 2005/0233148 A1 | 10/2005 | Fares-Karam |
| 2011/0263115 A1 | 10/2011 | Ganguli et al. |

(Continued)

*Primary Examiner* — Nathan W Ha
(74) *Attorney, Agent, or Firm* — Hauptman Ham, LLP

(57) ABSTRACT

A gate structure includes a gate dielectric layer over a semiconductor workpiece. The gate structure further includes a work function layer over the gate dielectric layer, wherein the work function layer has a U-shape profile. The gate structure further includes an adhesion layer over the work function layer, wherein a surface of the adhesion layer farthest from the work function layer is substantially free of oxygen atoms. The gate structure further includes a conductive layer over the adhesion layer, wherein the conductive layer has an I-shape profile.

20 Claims, 7 Drawing Sheets

Related U.S. Application Data

(60) Provisional application No. 62/512,331, filed on May 30, 2017.

(51) Int. Cl.
*H01L 29/417* (2006.01)
*H01L 29/08* (2006.01)

(56) References Cited

U.S. PATENT DOCUMENTS

| | | |
|---|---|---|
| 2012/0305298 A1 | 12/2012 | Uang et al. |
| 2013/0234254 A1 | 9/2013 | Ng et al. |
| 2014/0061728 A1 | 3/2014 | Trivedi |
| 2014/0353719 A1* | 12/2014 | Kim ............... H01L 29/785 257/192 |
| 2015/0214226 A1* | 7/2015 | Su ............... H01L 21/02299 257/401 |
| 2015/0214319 A1* | 7/2015 | Li ............... H01L 29/66606 257/288 |
| 2015/0279680 A1 | 10/2015 | Kashefi et al. |
| 2015/0325662 A1* | 11/2015 | Wang ............... H01L 21/28079 438/589 |
| 2016/0087037 A1* | 3/2016 | Cheng ............... H01L 21/823814 257/392 |
| 2016/0099337 A1 | 4/2016 | Cheng et al. |
| 2016/0133472 A1* | 5/2016 | Kim ............... H01L 21/28088 438/283 |
| 2016/0225868 A1* | 8/2016 | Kim ............... H01L 21/823462 |
| 2016/0233164 A1* | 8/2016 | Choi ............... H01L 29/785 |
| 2016/0322471 A1 | 11/2016 | JangJian et al. |
| 2016/0380066 A1 | 12/2016 | Lin et al. |
| 2017/0092740 A1 | 3/2017 | Wu et al. |
| 2017/0117141 A1* | 4/2017 | Zhu ............... H01L 21/28088 |
| 2017/0117191 A1* | 4/2017 | Zhou ............... H01L 21/28556 |
| 2017/0125305 A1* | 5/2017 | Zhou ............... H01L 21/0262 |
| 2017/0133489 A1* | 5/2017 | Zhou ............... H01L 29/7853 |
| 2017/0162575 A1* | 6/2017 | Li ............... H01L 21/32115 |
| 2017/0294315 A1* | 10/2017 | Deng ............... H01L 21/3212 |
| 2017/0373058 A1 | 12/2017 | Tsau et al. |
| 2019/0172716 A1* | 6/2019 | Graoui ............... H01L 21/02186 |

* cited by examiner

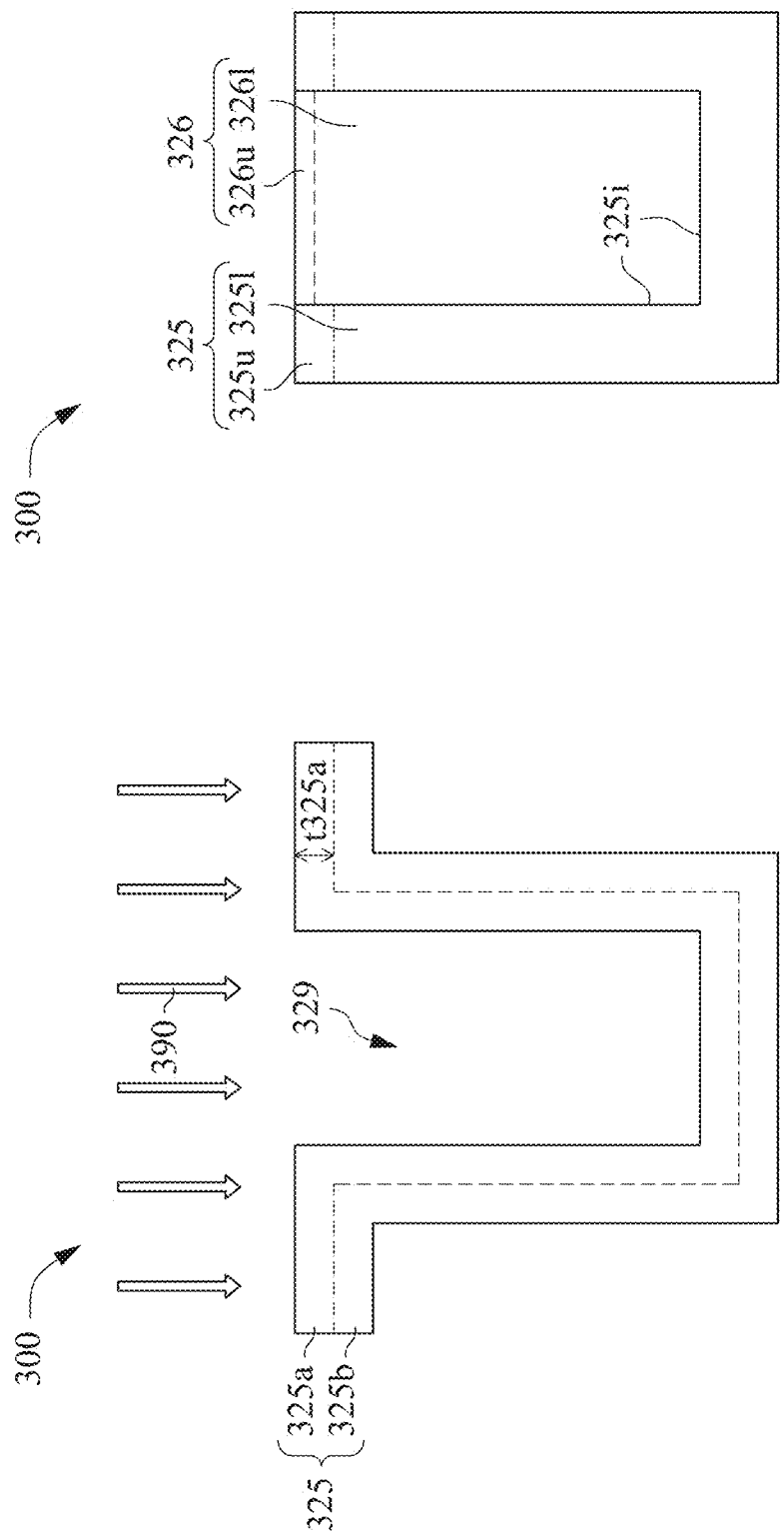

SEMICONDUCTOR DEVICE WITH ADHESION LAYER

PRIORITY CLAIM

The present application is a divisional of U.S. application Ser. No. 15/708,593, filed Sep. 19, 2019, which claims the priority of U.S. Provisional Application No. 62/512,331, filed May 30, 2017, which are incorporated herein by reference in their entireties.

BACKGROUND

When a semiconductor device, such as a metal-oxide-semiconductor field effect transistor (MOSFET) or a MOS resistor, is scaled down through various technology nodes, a high dielectric constant κ (high-K) dielectric (as compared to silicon dioxide) and a conductive material are used to form a gate structure. Within the gate structure, an adhesion layer is configured to help ensure a uniform adhesion of a subsequent layer on the adhesion layer. The adhesion layer is further used to improve a filling of the subsequent layer in a gate replacement technique, help to reduce voids in the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3H are cross-sectional views of a semiconductor device at various stages of manufacturing in accordance with one or more embodiments.

DETAILED DESCRIPTION

Figure 1:
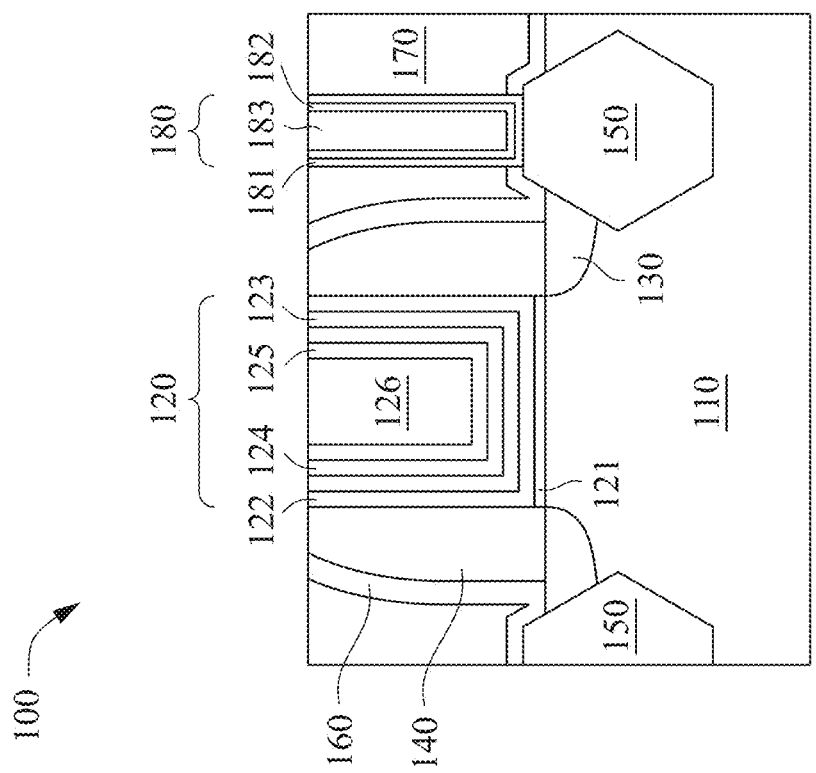
FIG. 1 is a cross-sectional view of a semiconductor device in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

The semiconductor integrated circuit (IC) industry has experienced rapid growth. Technological advances in IC materials and design have produced generations of ICs where each generation has smaller and more complex circuits than the previous generation. Such advances have increased the complexity of manufacturing processing with respect to a greater functional density at a smaller geometric size of a chip, thereby increasing a gate leakage when operating a semiconductor device. In order to reduce the gate leakage, a combination of high dielectric constant κ (high-K) dielectric and metal gate electrode (HK/MG) is introduced to replace silicon oxide and polysilicon of a gate electrode. One manufacturing process of implementing the HK/MG is called a gate last or a replacement gate technique, wherein a gate stack is initially formed, various processes associated with a semiconductor device are performed, and a portion of the gate stack is removed and replaced with the HK/MG. Various layers are deposited during the replacement process in order to serve different functions. For example, an adhesion layer is used to improve interface quality for filling of an opening with a subsequent conductive layer so that the conductive layer is substantially free of voids, pits, and/or seams.

In some embodiments, a redox reaction is performed on the adhesion layer in-situ or after the formation of the adhesion layer. The redox reaction includes a plasma treatment or an annealing process involving a hydrogen-containing gas or carbon monoxide. In some embodiments, one or more redox reactions are performed for each metallic layer in the gate structure. In such a way, the gate structure is substantially free of voids and/or pits in the central conductive layer compared with gate structures manufactured by other approaches, which improves a production yield and reliability. In some embodiments, an interface between neighboring layers is substantially free of oxygen atoms, thereby reducing an electrical resistance of the gate structure. In some embodiments, the redox reaction is performed in the fabrication of other semiconductor features, such as a contact plug or a via plug, to improve a filling process in an opening having a narrow diameter.

FIG. 1 is a cross-sectional view of a semiconductor device 100 in accordance with one or more embodiments. Semiconductor device 100 includes a workpiece 110, a gate structure 120, lightly doped drain (LDD) features 130, spacers 140, source/drain feature 150, an etch stop layer 160, an inter-layer dielectric (ILD) 170 and a contact plug 180.

Workpiece 110 includes a semiconductor material, such as silicon, germanium, silicon-germanium, silicon-carbide, III-V compounds or another suitable material. In some embodiments, workpiece 110 is a silicon on insulator layer (SOI) substrate or a silicon on sapphire (SOS) substrate. Workpiece 110 is a substrate having a planar top surface. At least one isolation feature, also referred to as a shallow trench isolation (STI), is in the substrate to separate active areas from each other. A top surface is substantially co-planar with the top surface of the substrate. Alternatively, workpiece 110 is a fin structure extending from the substrate. In some embodiments, the fin structure includes a same material as the substrate. In some embodiments, the fin structure includes a different material than the substrate. A space between adjacent fin structures and between one fin structure and another structure is filled with an isolation feature. In some embodiments, the isolation feature includes silicon oxide (SiO$_x$), silicon nitride, silicon oxynitride or another suitable dielectric material. A top surface of the isolation feature is below a top surface of the fin structure.

Gate structure 120 is referred to as an active component, such as a gate electrode in a field effect transistor (FET) or in a bipolar junction transistor (BJT), or a passive component, such as a resistor or an electrode of a capacitor. In some embodiments, gate structure 120 is over workpiece 110 and/or the isolation structure. Where workpiece 110 is a fin structure, gate structure 120 is further along opposite sidewalls of workpiece 110. Gate structure 120 includes an interfacial layer 121, an insulating layer 122, a work function layer 123, a blocking layer 124, an adhesion layer 125 and a conductive layer 126.

Interfacial layer 121 is in contact with and over workpiece 110. Interfacial layer 121 is configured to improve an interface between a surface of workpiece 110 and a surface of insulating layer 122 for reducing damage and defects. For example, in some instances, interfacial layer 121 passivates dangling bonds at the surface of workpiece 110, providing an interface of low interface trap density (Dit). In some embodiments, interfacial layer 121 includes a dielectric material, such as silicon oxide, germanium oxide, III-V compound oxide, combinations thereof or another appropriate material. Insulating layer 122 is in contact with and over interfacial layer 121. Insulating layer 122 is configured to electrically separate a gate terminal from an underlying source/drain feature. In at least one embodiment, insulating layer 122 includes silicon oxide. In various embodiments, insulating layer 122 includes a high-κ dielectric (as compared to silicon dioxide), such as hafnium oxide, hafnium silicon oxide, hafnium aluminum oxide, hafnium oxide doped with zirconium, zirconium oxide, hafnium silicon oxynitride, aluminum oxide, indium oxide, lanthanum oxide, yttrium oxide, combinations thereof or another appropriate material. In some embodiments, insulating layer 122 has a U-shaped profile.

Work function layer 123 is in contact with and over insulating layer 122. Work function layer 123 is configured to tune a work function between the gate terminal and workpiece 110. For an n-type device, work function layer 123 is adjusted to be close to a conduction band of workpiece 110. For a p-type device, work function layer 123 is adjusted to be close to a valence band of workpiece 110. In some embodiments where workpiece 110 includes silicon, work function layer 123 includes tungsten, tungsten nitride, titanium nitride, molybdenum nitride, iridium, cobalt, nickel, aluminum, tantalum, tantalum nitride, molybdenum, combinations thereof or another appropriate material. In comparison with a work function layer manufactured by other approaches, an interface between a surface of work function layer 123 and a surface of blocking layer 124 is substantially free of oxygen atoms. In some embodiments, work function layer 123 has a U-shaped profile.

In at least one embodiment, an optional capping layer (not shown) is between work function layer 123 and insulating layer 122. The capping layer is configured to help conduct electricity and prevent inter-diffusion/reaction between work function layer 123 and insulating layer 122. In some embodiments, the capping layer includes titanium nitride, tantalum nitride or tantalum carbide.

Blocking layer 124 is in contact with and over work function layer 123. Blocking layer 124 is configured to help prevent diffusion and/or penetration of metallic atoms from conductive layer 126 to work function layer 123. In some embodiments, blocking layer 124 includes metallic nitride, such as titanium nitride, tantalum nitride, titanium aluminum nitride, combinations thereof or another appropriate material. In comparison with blocking layers manufactured by other approaches, an interface between a surface of blocking layer 124 and a surface of adhesion layer 125 is substantially free of oxygen atoms. In some embodiments, blocking layer 124 has a U-shaped profile.

Adhesion layer 125 is in contact with and over blocking layer 124. In some instances, adhesion layer 125 is referred to as a wetting layer. Adhesion layer 125 is configured to help provide a uniform adhesion of conductive layer 126 and reduce an aggregation and/or agglomeration of conductive layer 126 during a formation process of the conductive layer 126. In some embodiments, adhesion layer 125 includes titanium, titanium nitride, cobalt, nickel, tungsten nitride, a combination thereof or another appropriate material. In comparison with adhesion layers manufactured by other approaches, an interface between a surface of adhesion layer 125 and a surface of conductive layer 126 is substantially free of oxygen atoms.

Conductive layer 126 is in contact with and over adhesion layer 125. Conductive layer 126 is configured to help accelerate a circuity speed for charging and discharging a gate capacitance. In some embodiments, conductive layer 126 includes aluminum, aluminum titanium, tungsten, copper, alloys thereof, combinations thereof or another appropriate material.

LDD feature 130 is in workpiece 110 and is substantially aligned with sidewalls of gate structure 120. LDD feature 130 is configured to help prevent hot carrier injection (HCI) lifetime degradation. Depending on a conductive type of semiconductor device 100, in some embodiments, LDD feature 130 includes n-type or p-type dopants, such as boron, arsenide, indium, phosphorous, combinations thereof or another appropriate dopants.

Spacers 140 are over workpiece 110 and along sidewalls of gate structure 120. In at least one embodiment, spacers 140 are configured to protect gate structure 120 and define a spacing between gate structure 120 and source/drain feature 150. In various embodiments, spacers 140 are configured to define a trench for a gate replacement (also referred to as gate last) technique. Spacers 140 include a dielectric material, such as silicon oxide, silicon nitride, silicon oxynitride, silicon carbide, silicon carbon nitride, silicon oxy-carbon-nitride, combinations thereof or another appropriate material.

Source/drain features 150 are in workpiece 110 and at opposite sides of gate structure 120. In some embodiments, source/drain features 150 overlap LDD feature 130. In at least one embodiment, source/drain features 150 include the n-type or the p-type dopants. In various embodiments, source/drain features 150 include a strained material, such as silicon germanium, silicon carbide or another appropriate material.

Etch stop layer 160 is over workpiece 110 and continuously along a top surface of source/drain feature 150 and sidewalls of spacers 140. Etch stop layer 160 is configured to provide a high etch selectivity with that of ILD 170. In various embodiments, etch stop layer 160 is configured to provide a tensile/compressive stress over a channel region of a transistor. In some embodiments, etch stop layer 160 includes silicon nitride, silicon carbon nitride, doped silicon oxide, combinations thereof or another appropriate material.

ILD 170 is over etch stop layer 160 and is between gate structure 120 and contact plug 180. In some embodiments, ILD 170 includes a dielectric material, such as silicon oxide, silicon nitride, silicon oxynitride, or another appropriate material. In various embodiments, ILD 170 includes a low-κdielectric (as compared to silicon dioxide) material or an extreme low low-κdielectric (smaller than 2.6) material.

Contact plug 180 includes a barrier layer 181, an adhesion layer 182 and a conductive layer 183. Barrier layer 181 is over and is in contact with source/drain feature 150 via a silicide feature. Barrier layer 181 is configured to help prevent diffusion of metallic atoms from conductive layer 183 to ILD 170. In some embodiments, barrier layer 181 includes metallic nitride, such as titanium nitride, tantalum nitride, titanium aluminum nitride, combinations thereof or another appropriate material. Adhesion layer 182 is over barrier layer 181 and is configured to help provide a uniform adhesion of conductive layer 183 and reduce an aggregation and/or agglomeration of conductive layer 183 during a formation process of conductive layer 183. In comparison with adhesion layers manufactured by other approaches, an interface between a surface of adhesion layer 182 and a surface of conductive layer 183 is substantially free of oxygen atoms.

Figure 2:
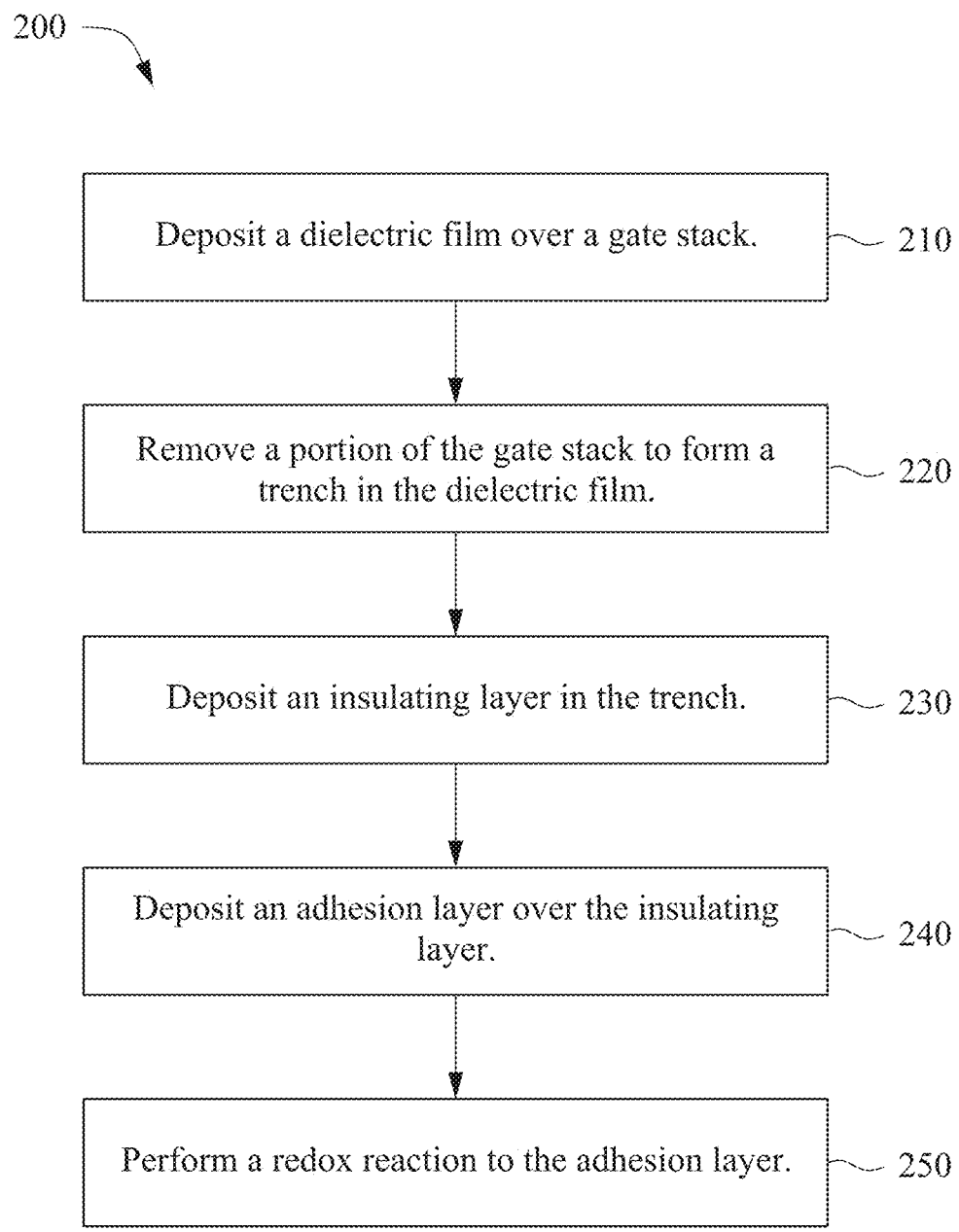
FIG. 2 is a flow chart of a method of fabricating a semiconductor device in accordance with one or more embodiments.

FIG. 2 is a flow chart of a method 200 of fabricating a semiconductor device in accordance with one or more embodiments. One of ordinary skill in the art would understand that additional operations are able to be performed before, during, and/or after method 200 depicted in FIG. 2. Additional details of the fabricating process are provided below with respect to FIGS. 3A-3H, in accordance with some embodiments.

Method 200 includes operation 210 in which a dielectric film, e.g., ILD 170 in FIG. 1, is deposited over a gate stack. The deposition of the dielectric film includes chemical vapor deposition (CVD), spin-on coating, atomic layer deposition (ALD), physical vapor deposition (PVD) or another suitable process. Next, a planarization process such as chemical mechanical polish (CMP) is performed to remove excess portions of the dielectric film so that a top surface of the dielectric film is sufficiently planar for a subsequent lithography process. The gate stack includes an interfacial layer, a sacrificial layer and a hard mask layer. The formation of the gate stack includes a series of deposition, lithography and etching processes. In some embodiments, the gate stack is referred to as a dummy gate stack.

Method 200 continues with operation 220 in which a portion of the gate stack is removed to form a trench in the dielectric film. In some embodiments, the trench is defined by spacers along sidewalls of the gate stack. In some embodiments without the spacers, the sidewalls of trench expose the dielectric film. The removal of the gate stack includes a dry etching, a wet etching, or a combination thereof. During the removal process, at least the hard mask layer and the sacrificial layer are removed. In some embodiments, the hard mask layer and the sacrificial layer are removed in a single step or sequential steps. In at least one embodiment, an entirety of the gate stack, i.e., including the interfacial layer, is removed. In some embodiments where the interfacial layer includes silicon oxide, a buffered hydrogen fluoride or a buffered oxide etchant (BOE) is used to expose a top surface of the fin structure or the substrate.

Method 200 continues with operation 230 in which an insulating layer, e.g., insulating layer 122 in FIG. 1, is deposited in the trench. The deposition of the insulating layer includes CVD, ALD, spin-on coating or another appropriate process. In some embodiments where the interfacial layer is removed in operation 220, another interfacial layer is formed prior to the deposition of the insulating layer. The formation of the interfacial layer includes a thermal oxidation or a deposition process.

Method 200 continues with operation 240 in which an adhesion layer, e.g., adhesion layer 125 in FIG. 1, is deposited over the insulating layer. In particular, the adhesion layer conformally and continuously extends along sidewalls, shoulders and a bottom portion of the trench. The deposition of the adhesion layer includes PVD, ALD, plating, sputtering, CVD, combinations thereof or another suitable material. In some embodiments, the adhesion layer includes a single material. In some embodiments, the adhesion layer includes more than one material.

Method 200 continues with operation 250 in which a redox reaction is performed on the adhesion layer. The redox reaction is performed using a reducing agent. In some embodiments, the reducing agent is formed using plasma treatment and a hydrogen-containing gas, such as hydrogen, ammonia gas, or nitrogen-hydrogen gas. In some embodiments, the reducing agent includes carbon monoxide. The reducing agent reacts with oxygen atoms/molecules within the adhesion layer to remove a metallic oxide formed during/after the deposition process. In some embodiments, a flow rate of the reducing agent is in a range from about 5 standard cubic centimeters per minute (sccm) to about 500 sccm. A smaller flow rate is insufficient to conduct the redox reaction, thereby increasing a difficulty of a subsequent filling process, in some instances. A greater flow rate increases manufacturing costs without a significant improvement in efficiency, in some instances. In some embodiments, the reducing agent is mixed with an inert gas, such as argon, nitrogen or helium. In some embodiments, a flow rate of the inert gas is in a range from about 10 sccm to about 1,0000 sccm. In some embodiments, a ratio of the reducing agent to the inert gas is from about 1:2 to about 1:20. A smaller ratio insufficiently reduces oxygen atoms/molecules, in some instances.

In some embodiments, the plasma is generated using direct current (DC), radio frequency (RF), inductively coupled plasma (ICP), capacitively coupled plasma (CCP), electron cyclotron resonance plasma (ECR) or microwave plasma at a power ranging from about 50 watts to about 5,000 watts. For example, in some embodiments where the plasma is generated using RF, the power is in a range from about 500 watts to about 1,000 watts. A greater power increases a possibility of damage to the semiconductor device, in some instances. A smaller power is insufficient to complete the redox reaction, in some instances. In some embodiments, an electrical field is enhanced to induce charged particles to move toward the adhesion substrate. An operation pressure is in a range from about 35 mTorr to about 10 Torr and an operation temperature is in a range from about 15 degrees Celsius to about 420 degrees Celsius. A higher temperature increases a thermal budget of the semiconductor device fabrication, causing undesired thermal diffusion of dopants and therefore degrading an operating performance, in some instances. A lower temperature is insufficient to complete the redox reaction, in some instances. In some embodiments, the plasma treatment lasts from about 5 seconds to about 300 seconds. A longer time period increase a possibility of damage to the surface of the adhesion layer, in some instances. A shorter time period provides insufficient removal of metallic oxide, in some instances.

In various embodiments, the redox reaction is performed using an annealing process with a hydrogen-containing gas or carbon monoxide. The annealing process includes rapid thermal annealing, flash annealing, laser annealing, or another appropriate method. In some embodiments, an operation pressure is in a range from about 10 Torr to about 100 Torr and an operation temperature is in a range from about 650 degrees Celsius to about 950 degrees Celsius. A higher temperature increases a thermal budget of the semiconductor device fabrication, in some instances. A lower temperature provides insufficient treatment to the adhesion layer, in some instances. In some embodiments, the annealing process lasts from about 1 minute to about 60 minutes. A shorter time period provides insufficient removal of metallic oxide, in some instances. A longer time period increase a thermal budget of the semiconductor fabrication, in some instances.

As a result, after the redox reaction is performed, oxygen atoms existing in the surface of the adhesion layer are removed to a depth of about 100 angstrom (Å). In some embodiments, a concentration of oxygen atoms is reduced by at least 5% by weight of the adhesion layer. In addition, a contact angle between the treated adhesion layer and a water droplet is reduced by from about 15 degrees to about 75 degrees than that between an untreated adhesion layer and a water droplet. In some embodiments, the redox reaction is optionally performed in-situ or after the formation of a work function layer, a capping layer, a blocking layer and/or a conductive layer to remove undesired metallic oxides. In some embodiments, each metallic layer of a gate structure, e.g., gate structure 120 in FIG. 1, is treated using a same reducing agent. For example, each metallic layer of the gate structure is treated in a hydrogen environment. Alternatively, at least one metallic layer of the gate structure is treated using a different reducing agent than the other metallic layers. For example, the work function layer is treated in a carbon monoxide environment and the adhesion layer is treated in a hydrogen environment.

In some embodiments, operations 230-250 are performed in a same processing chamber. In some embodiments, at least one of operations 230-250 is performed in a different chamber from at least one other of operations 230-250. In various embodiments, a queue time (Q-time) between two deposition processes is in a range from about 30 minutes to about 1 hour. As a result, a task queue of manufacturing processes is improved and traffic jam of wafer transportation is reduced. The Q-time means a time a wafer is waiting and/or exposed to open air due to a priority stage. In some embodiments, the Q-time between operation 240 and operation 250 is from about 1 hour to about 6 hours. In comparison with devices manufactured by other approaches, even if method 200 is performed under a similar or a longer Q-time, an interface between the adhesion layer and a precedent/subsequent layer is substantially free of oxygen atoms.

In some embodiments, an order of operations in method 200 is modified. For example, operation 240 and operation 250 are performed simultaneously. As another example, operation 250 is performed prior to operation 240, in some instances. In some embodiments, additional operations are included in method 200, for example, a conductive layer is deposited over the adhesion layer and then another hydrogen-containing plasma treatment is performed to the conductive layer.

FIGS. 3A-3H are cross-sectional views of a semiconductor device 300 at various stages of manufacturing in accordance with one or more embodiments. Semiconductor device 300 includes elements similar to semiconductor device 100 and a last two digits of like elements are the same.

Figure 3B:
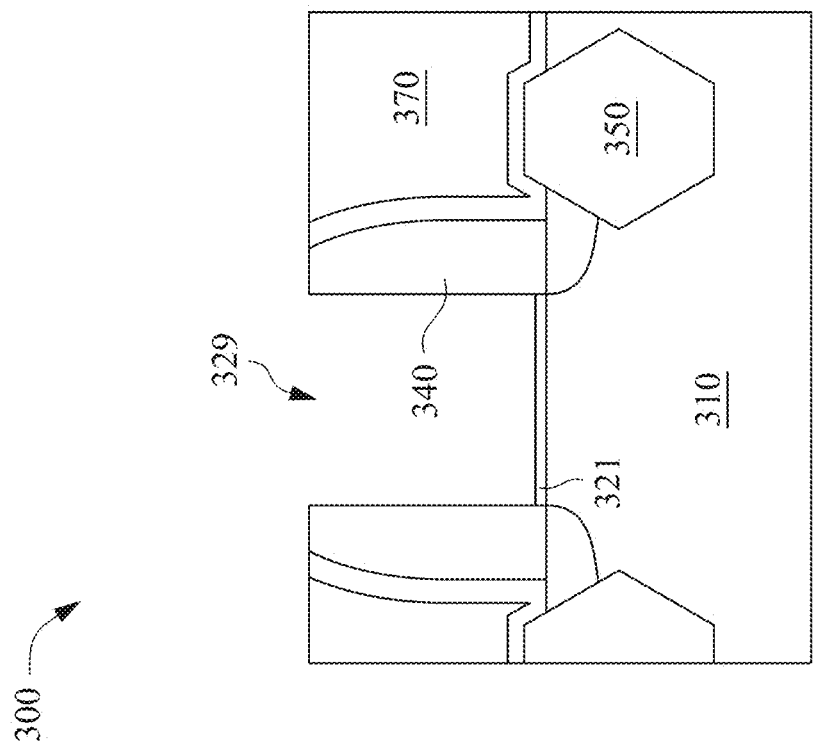
Figure 3A:
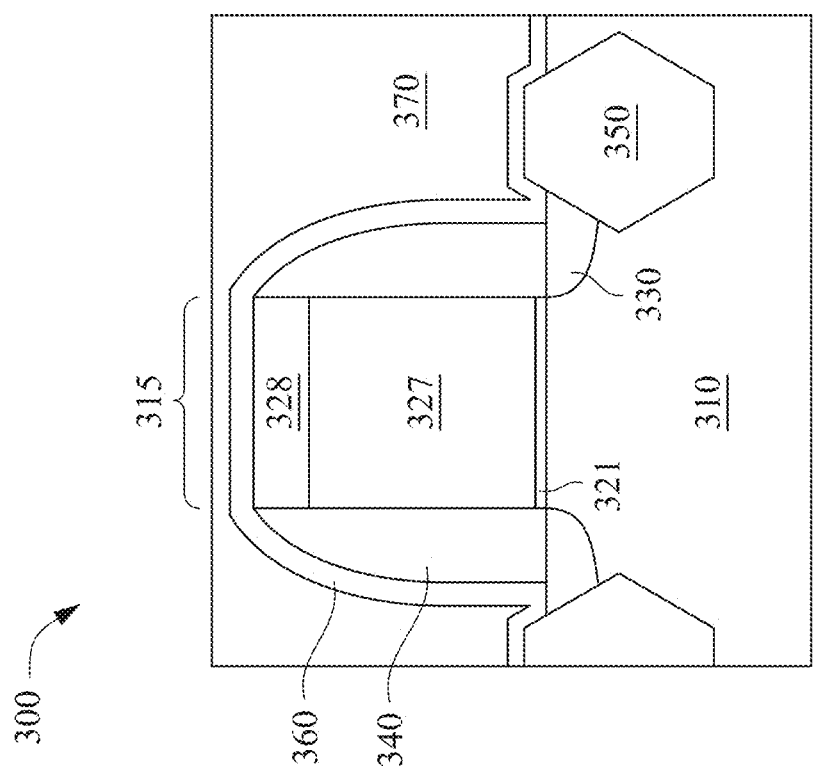

FIG. 3A is a cross-sectional view of semiconductor device 300 following operation 210 in accordance with one or more embodiments. Semiconductor device 300 includes a gate stack 315 over a workpiece 310, spacers 340 along sidewalls of gate stack 315, source/drain features 350 at opposite sides of gate stack 315, an etch stop layer 360 continuously along source/drain features 350, spacers 340 and gate stack 315, and an ILD 370 blanket over etch stop layer 360. In particular, gate stack 315 includes an interfacial layer 321 over workpiece 310, a sacrificial layer 327 over interfacial layer 321 and a hard mask layer 328 over sacrificial layer 327. In some embodiments, a thickness of interfacial layer 321 ranges from about 5 angstrom (Å) to about 15 Å. A greater thickness adversely affects equivalent oxide thickness of semiconductor device 300, in some instances. The equivalent oxide thickness determines how thick a layer of silicon oxide would be to induce a same effect as a gate insulating film being used. A smaller thickness increases an interfacial density between interfacial layer 321 and workpiece 310, in some instances. In some embodiments, sacrificial layer 327 includes polysilicon, amorphous silicon, silicon germanium or another appropriate material and hard mask layer 328 is configured to provide an etching selectivity with respect to sacrificial layer 327. After the deposition of ILD 370, a planarization process, such as chemical mechanical polish (CMP), is performed to remove excess portions of ILD 370.

FIG. 3B is a cross-sectional view of semiconductor device 300 following operation 220 in accordance with one or more embodiments. A trench 329 is formed by removing hard mask layer 328 and sacrificial layer 327. In some embodiments, hard mask layer 328 is removed by continuing the planarization process of ILD 370. Next, sacrificial layer 327 is removed using an etch process including a wet etching or a dry etching. In some embodiments, the removal of hard mask layer 328 and sacrificial layer 327 is performed in a single step. Alternatively, the removal of hard mask layer 328 and sacrificial layer 327 is performed in sequential steps. In some embodiments, for example, when semiconductor device 300 is a core device, interfacial layer 321 is removed and is followed by a re-growth of a replacement interfacial layer. Trench 329 is defined by a spacing between spacers 340 and a top surface of interfacial layer 321. In particular, an upper portion of spacers 340 is removed during the removal of hard mask layer 328.

Figure 3D:
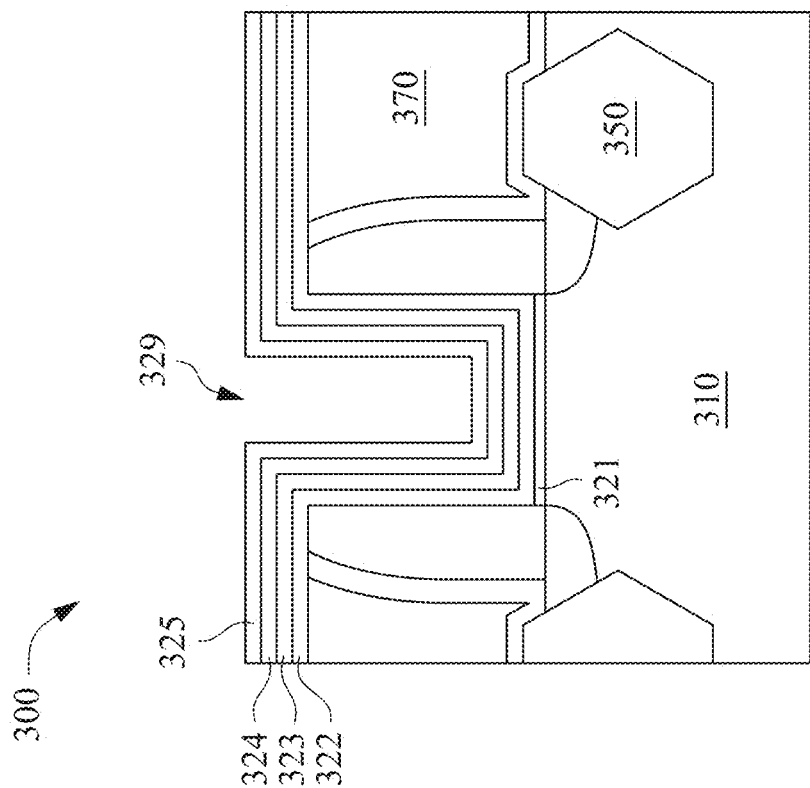
Figure 3C:
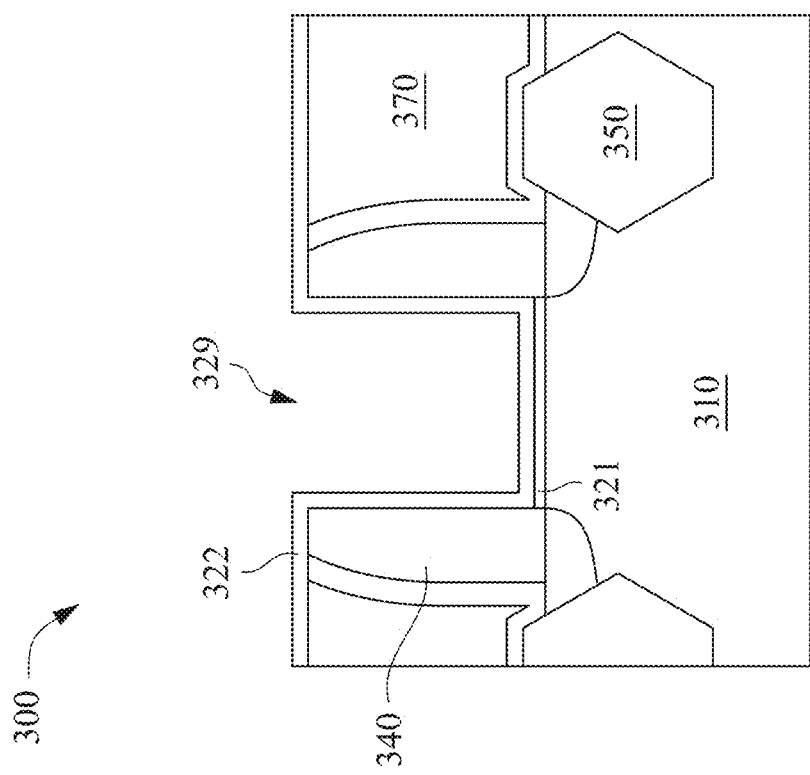

FIG. 3C is a cross-sectional view of semiconductor device 300 following operation 230 in accordance with one or more embodiments. A gate insulating layer 322 is continuously over sidewalls and a bottom surface of trench 329. Because a threshold voltage of semiconductor device 300 is substantially proportional to a thickness of gate insulating layer 322, in some cases, the thickness of gate insulating layer 322 ranges from about 10 Å to about 30 Å. A thinner gate insulating layer 322 increases a difficulty during a deposition process, in some instances. A thicker gate insulating layer 322 increases a difficulty during a subsequent filling process, in some instances.

FIG. 3D is a cross-sectional view of semiconductor device 300 following operation 240 in accordance with one or more embodiments. A work function layer 323 is over gate insulating layer 322, covering sidewalls and the bottom surface of trench 329. In at least one embodiment, a capping layer is formed between gate insulating layer 322 and work function layer 323. In various embodiments, a first redox reaction is optionally performed in-situ or after the formation of work function layer 323. Next, a blocking layer 324 is over work function layer 323, covering sidewalls and the bottom surface of trench 329. In various embodiments, a second redox reaction is optionally performed in-situ or after the formation of blocking layer 324. Next, an adhesion layer 325 is over blocking layer 324, covering sidewalls and the bottom surface of trench 329. In some embodiments, adhesion layer 325 has a thickness ranging from about 10 Å to about 100 Å. A thicker adhesion layer 325 increases a difficulty of a subsequent filling process, in some instances. A thinner adhesion layer 325 ensures insufficient adhesion of a subsequent conductive layer on adhesion layer 325, in some instances. A third redox reaction is performed in-situ or after the formation of adhesion layer 325.

FIG. 3E is a cross-sectional view of a portion of semiconductor device 300 following operation 250 in accordance with one or more embodiments. In particular, FIG. 3E is an enlarged view of adhesion layer 325. Adhesion layer 325 includes a first portion 325a and a second portion 325b. In some embodiments, first portion 325 has a thickness t325a ranging from about 7 Å to about 75 Å. In some embodiments, due to a Q-time lasting more than 1 hour, t325a is substantially equal to a thickness of adhesion layer 325. By performing a redox reaction 390, oxygen atoms existing in first portion 325a are substantially removed so that first portion 325a has approximately a same oxygen concentration as second portion 325b. In comparison with first portion formed by other approaches, first portion 325a has a smaller oxygen concentration and a smaller contact angle relative to a water droplet, thereby improving a subsequent filling process for the remainder of trench 329. As a result, the smaller contact angle helps a filling process of trench 329 and reduces a formation of aggregation and/or agglomeration. The gate structure is free of voids and pits, resulting in an improvement in performance and product reliability.

FIG. 3F is a cross-sectional view of a portion of semiconductor device 300 in accordance with one or more embodiments. In particular, FIG. 3F is an enlarged view of adhesion layer 325 and a conductive layer 326. The remainder of trench 329 is filled with conductive layer 326 after redox reaction 390. In some embodiments, a fourth redox reaction is optionally performed in-situ or after the filling process of conductive layer 326. In at least one embodiment, an interface 325i between adhesion layer 325 and conductive layer 326 is substantially free of oxygen atoms. The deposition of conductive layer 326 includes PVD, ALD, CVD, spin-on coating, platting combinations thereof or another appropriate method. For example, a first portion of conductive layer 326 is deposited using CVD and a second portion of conductive layer 326 is deposited using PVD. In some embodiments where adhesion layer 325 includes titanium and conductive layer 326 includes aluminum, during the redox reaction, a portion of adhesion layer 325 reacts with a portion of conductive layer 326 and forms titanium aluminide at interface 325i.

Next, a planarization process, such as CMP, is performed to remove excess portions of each layer outside trench 329 to form a gate structure. As a result, gate insulating layer 322, work function layer 323, blocking layer 324, adhesion layer 325 and conductive layer 326 are partially exposed. The planarization process has a high selectivity to provide a substantially planar surface for the gate structure and ILD 370. After the planarization process, adhesion layer 325 has an upper portion 325u and a lower portion 325l, and the upper portion 325u has a greater oxygen concentration than that of lower portion 325l because the gate structure is exposed to ambient air. In some embodiments where adhesion layer 325 includes titanium, upper portion 325u has from about 5% to about 55% greater oxygen atoms by weight than lower portion 325l. In some embodiments where adhesion layer 325 includes titanium, upper portion 325u has from about 30% to about 55% greater oxygen atoms by weight than lower portion 325l. Conductive layer has an upper portion 326u and a lower portion 326l. In some embodiments, upper portion 326u has a greater oxygen concentration than that of lower portion 326l. In some embodiments where conductive layer includes aluminum, upper portion 326 has from about 5% to about 20% greater oxygen atoms by weight than lower portion 326l.

Figure 3H:
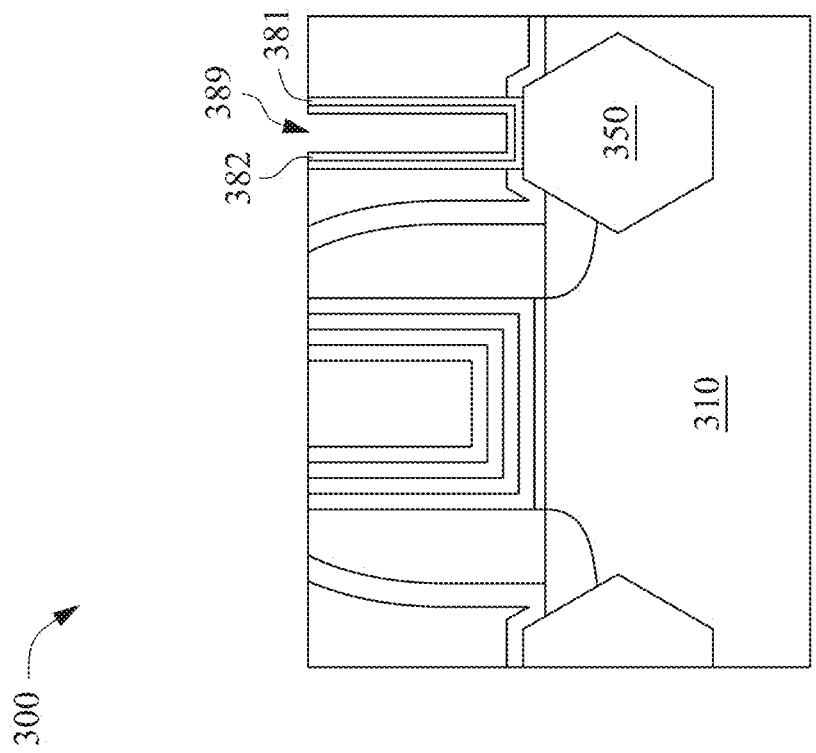
Figure 3G:
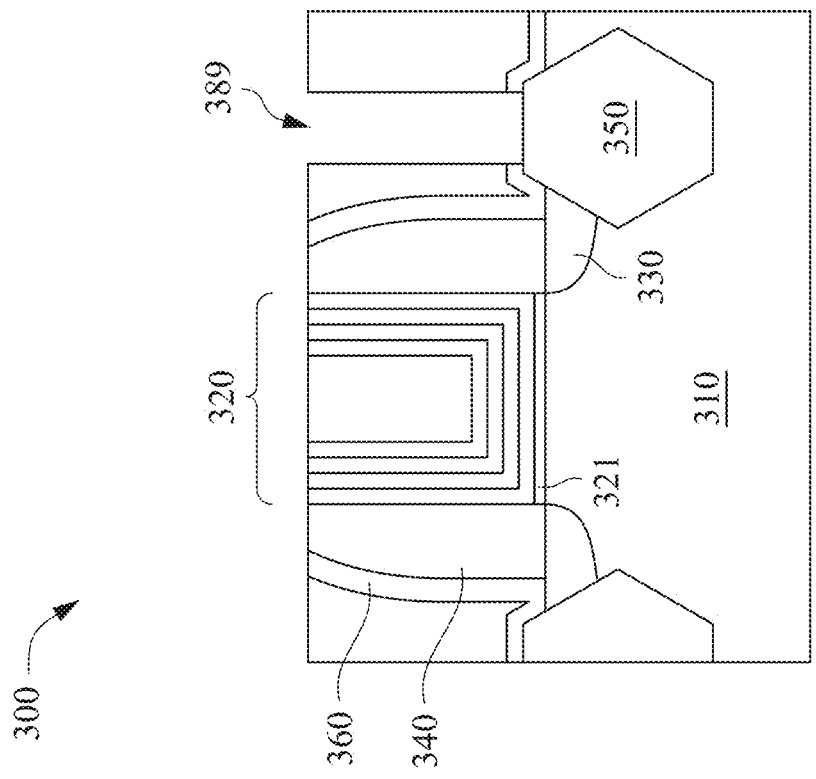

FIG. 3G is a cross-sectional view of semiconductor device 300 in accordance with one or more embodiments. An opening 389 is formed in ILD 370 until a top surface of source/drain feature 350 is exposed, in some instances. The formation of opening 389 includes a lithography process and an etch process. In at least one embodiment, the etch process includes a dry etching, such as reactive ion etching (RIE).

FIG. 3H is a cross-sectional view of semiconductor device 300 in accordance with one or more embodiments. After the formation of opening 389, a barrier layer 381 is continuously deposited in opening 389, covering sidewalls and a bottom surface of opening 389. The deposition process includes PVD, ALD, plating or another appropriate method. In some various embodiments, a fifth redox reaction is optionally performed in-situ or after the formation of barrier layer 381. Next, an adhesion layer 382, also referred to as a glue layer in some instances, is continuously deposited over barrier layer 381 and in opening 389, covering sidewalls and a bottom surface of opening 389. Adhesion layer 382 includes titanium, titanium nitride, tantalum, tantalum nitride, tungsten nitride or another appropriate material. A thickness of adhesion layer 382 ranges from about 5 Å to about 200 Å. A thicker or a smaller adhesion layer increases a difficulty of a subsequent filling process, in some instances. In particular, a thicker adhesion layer reduces the space for the conductive layer; a thinner adhesion layer reduces the adhesion ability between the adhesion layer and the conductive layer, in some instances. In some embodiments, adhesion layer 382 is deposited using a same method as barrier layer 381. In some embodiments, adhesion layer 382 is deposited using a different method from barrier layer 381. In various embodiments, a sixth redox reaction is optionally performed in-situ or after the formation of adhesion layer 382. By performing the redox reaction, oxygen atoms existing in adhesion layer 382 are substantially removed. Next, after the remainder of trench 329 is filled with a conductive layer, an interface between adhesion layer 382 and the conductive layer is substantially free of oxygen atoms.

Figure 4:
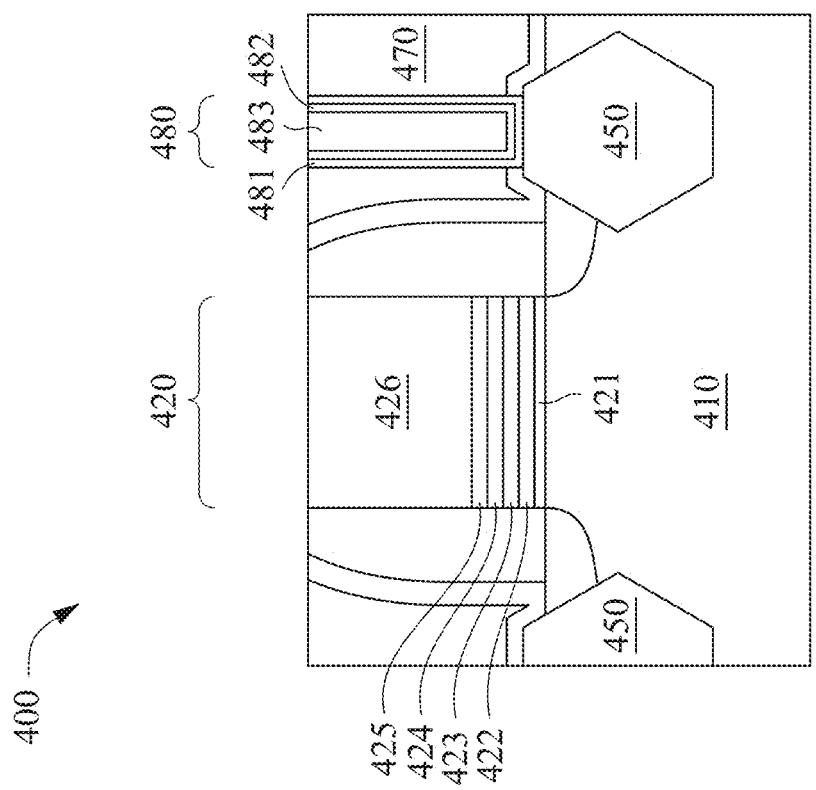
FIG. 4 is a cross-sectional view of a semiconductor device in accordance with one or more embodiments.

FIG. 4 is a cross-sectional view of a semiconductor device in accordance with one or more embodiments. Semiconductor device 400 includes elements similar to semiconductor device 100 and a last two digits of like elements are the same. Semiconductor device 400 includes a gate structure 420 over a workpiece 410, spacers 440 along sidewalls of gate structure 420, source/drain features 450 at opposite sides of gate structure 420, an etch stop layer 460 lying over source/drain features 450, spacers 440 and gate structure 420, and an ILD 470 over gate structure 420 and etch stop layer 460. Different from semiconductor device 300, each layer (interfacial layer 421, gate insulating layer 422, work function layer 423, blocking layer 424, adhesion layer 425, and conductive layer 426) of gate structure 420 is disposed with a rectangular shape (I-shape profile). In at least one embodiment, gate structure 420 is formed using a gate first technique. Similar to semiconductor device 100 and/or 300, one or more redox reactions are performed in-situ or after the formation of each layer of gate structure 420. In comparison with a gate structure manufactured by other approaches, gate structure 420 includes an interface between each of the neighboring layers that is substantially free of oxygen atoms. As a result, a filling process is improved as well as a resistance of gate structure 420 is reduced.

It is understood that each of the semiconductor device 100/300/400 undergoes further semiconductor manufacturing process flow to form various features such as conductive interconnect structures, interlayer dielectric, post-passivation layers, passivation layers or the like.

An aspect of this description relates to a gate structure. The gate structure includes a gate dielectric layer over a semiconductor workpiece. The gate structure further includes a work function layer over the gate dielectric layer, wherein the work function layer has a U-shape profile. The gate structure further includes an adhesion layer over the work function layer, wherein a surface of the adhesion layer farthest from the work function layer is substantially free of oxygen atoms. The gate structure further includes a conductive layer over the adhesion layer, wherein the conductive layer has an I-shape profile. In some embodiments, a contact angle between the adhesion layer and a water droplet ranges from about 25 degrees to about 70 degrees. In some embodiments, the gate structure further includes a blocking layer between the work function layer and the adhesion layer. In some embodiments, the adhesion layer includes at least one of titanium, titanium nitride, cobalt, nickel, or tungsten nitride. In some embodiments, the adhesion layer is substantially free of oxygen to a depth of about 100 Angstroms from an interface with the conductive layer. In some embodiments, the adhesion layer has the U-shaped profile. In some embodiments, the gate dielectric layer has the U-shaped profile.

An aspect of this description relates to a contact structure. The contact structure includes a barrier layer over a conductive feature in a workpiece, wherein the barrier layer has a U-shape profile. The contact structure further includes an adhesion layer over the barrier layer, wherein the adhesion layer has the U-shape profile. The contact structure further includes a conductive layer over the adhesion layer, wherein the conductive layer has an I-shape profile, and a surface of the adhesion layer contacting the conductive layer is substantially free of oxygen atoms. In some embodiments, a thickness of the adhesion layer ranges from about 5 Angstroms to about 200 Angstroms. In some embodiments, the adhesion layer includes titanium, titanium nitride, tantalum, tantalum nitride, or tungsten nitride. In some embodiments, an entirety of the adhesion layer is substantially free of oxygen atoms.

An aspect of this description relates to a semiconductor device. The semiconductor device includes a semiconductor workpiece. The semiconductor device includes a channel region in the semiconductor workpiece. The semiconductor device further includes a source/drain region in the semiconductor workpiece. The semiconductor device further includes a gate structure over the channel region. The gate structure includes a gate dielectric layer. The gate structure further includes a work function layer over the gate dielectric layer, wherein the work function layer has a U-shape profile. The gate structure further includes a first adhesion layer over the work function layer. The gate structure further includes a first conductive layer over the adhesion layer, wherein the first conductive layer has an I-shape profile, and a surface of the first adhesion layer adjacent to the first conductive layer is substantially free of oxygen atoms. In some embodiments, the semiconductor device includes a contact structure electrically connected to the source/drain region. In some embodiments, the contact structure includes a barrier layer over the source/drain region; a second adhesion layer over the barrier layer, wherein the second adhesion layer has the U-shape profile; and a second conductive layer over the second adhesion layer, wherein a surface of the second adhesion layer contacting the second conductive layer is substantially free of oxygen atoms. In some embodiments, a material of the first adhesion layer is a same material as a material of the second adhesion layer. In some embodiments, a material of the first adhesion layer is different from a material of the second adhesion layer. In some embodiments, a material of the first conductive layer is a same material as a material of the second conductive layer. In some embodiments, a material of the first conductive layer is different from a material of the second conductive layer. In some embodiments, a thickness of the second adhesion layer ranges from about 5 Angstroms to about 200 Angstroms. In some embodiments, an entirety of the second adhesion layer is substantially free of oxygen atoms. In some embodiments, the first adhesion layer is substantially free of oxygen to a depth of about 100 Angstroms from an interface with the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gate structure, comprising:
   a gate dielectric layer over a semiconductor workpiece;
   a work function layer over the gate dielectric layer, wherein the work function layer has a U-shape profile;
   an adhesion layer over the work function layer, wherein a surface of the adhesion layer farthest from the work function layer is substantially free of oxygen atoms; and
   a conductive layer over the adhesion layer, wherein the conductive layer has an I-shape profile.

2. The gate structure of claim 1, wherein a contact angle between the adhesion layer and a water droplet ranges from about 25 degrees to about 70 degrees.

3. The gate structure of claim 1, further comprising a blocking layer between the work function layer and the adhesion layer.

4. The gate structure of claim 1, wherein the adhesion layer comprises at least one of titanium, titanium nitride, cobalt, nickel, or tungsten nitride.

5. The gate structure of claim 1, wherein the adhesion layer is substantially free of oxygen to a depth of about 100 Angstroms from an interface with the conductive layer.

6. The gate structure of claim 1, wherein the adhesion layer has the U-shaped profile.

7. The gate structure of claim 1, wherein the gate dielectric layer has the U-shaped profile.

8. A contact structure comprising:
   a barrier layer over a conductive feature in a workpiece, wherein the barrier layer has a U-shape profile;
   an adhesion layer over the barrier layer, wherein the adhesion layer has the U-shape profile; and a conductive layer over the adhesion layer, wherein the conductive layer has an I-shape profile, a surface of the adhesion layer contacting the conductive layer is substantially free of oxygen atoms, and an alloy of the conductive layer and adhesion layer exists at an interface of the adhesive layer and the conductive layer.

9. The contact structure of claim 8, wherein a thickness of the adhesion layer ranges from about 5 Angstroms to about 200 Angstroms.

10. The contact structure of claim 8, wherein the adhesion layer comprises titanium, titanium nitride, tantalum, tantalum nitride, or tungsten nitride.

11. The contact structure of claim 8, wherein an entirety of the adhesion layer is substantially free of oxygen atoms.

12. A semiconductor device comprising:
a semiconductor workpiece;
a channel region in the semiconductor workpiece;
a source/drain region in the semiconductor workpiece; and
a gate structure over the channel region, wherein the gate structure comprises:
a gate dielectric layer;
a work function layer over the gate dielectric layer, wherein the work function layer has a U-shape profile;
a first adhesion layer over the work function layer; and
a first conductive layer over the adhesion layer, wherein the first conductive layer has an I-shape profile, a surface of the first adhesion layer adjacent to the first conductive layer is substantially free of oxygen atoms, and the first adhesion layer is substantially free of oxygen to a depth of about 100 Angstroms from an interface with the first conductive layer.

13. The semiconductor device of claim 12, further comprising a contact structure electrically connected to the source/drain region, wherein the contact structure comprises:
a barrier layer over the source/drain region;
a second adhesion layer over the barrier layer, wherein the second adhesion layer has the U-shape profile; and
a second conductive layer over the second adhesion layer, wherein a surface of the second adhesion layer contacting the second conductive layer is substantially free of oxygen atoms.

14. The semiconductor device of claim 13, wherein a material of the first adhesion layer is a same material as a material of the second adhesion layer.

15. The semiconductor device of claim 13, wherein a material of the first adhesion layer is different from a material of the second adhesion layer.

16. The semiconductor device of claim 13, wherein a material of the first conductive layer is a same material as a material of the second conductive layer.

17. The semiconductor device of claim 13, wherein a material of the first conductive layer is different from a material of the second conductive layer.

18. The semiconductor device of claim 13, wherein a thickness of the second adhesion layer ranges from about 5 Angstroms to about 200 Angstroms.

19. The semiconductor device of claim 13, wherein an entirety of the second adhesion layer is substantially free of oxygen atoms.

20. The semiconductor device of claim 12, wherein the first adhesion layer comprises titanium, the first conductive layer comprises aluminum, and titanium aluminide is present at an interface of the first adhesion layer and the first conductive layer.

* * * * *